United States Patent [19]
Gale

[11] Patent Number: 5,412,186
[45] Date of Patent: May 2, 1995

[54] ELIMINATION OF STICKING OF MICRO-MECHANICAL DEVICES

[75] Inventor: Richard O. Gale, Richardson, Tex.

[73] Assignee: Texas Instruments Incorporated, Dallas, Tex.

[21] Appl. No.: 200,260

[22] Filed: Feb. 23, 1994

[51] Int. Cl.6 .............................................. H05B 6/80
[52] U.S. Cl. ................................... 219/679; 219/750; 359/230; 359/900
[58] Field of Search ............... 219/678, 679, 696, 745, 219/750; 359/224, 230, 900

[56] References Cited

U.S. PATENT DOCUMENTS

| | | | |
|---|---|---|---|
| 4,196,332 | 4/1980 | Mackayb et al. | 219/750 |
| 5,200,735 | 4/1993 | Hines | 340/539 |
| 5,331,454 | 7/1994 | Hornbeck | 359/230 |

Primary Examiner—Philip H. Leung
Attorney, Agent, or Firm—Julie L. Reed; James C. Kesterson; Richard L. Donaldson

[57] ABSTRACT

A method of preventing sticking of moving parts of a micro-mechanical device. A set of microwave frequencies, which will cause water molecules to resonate, is determined. From this set of frequencies, an applied frequency that will provide an efficient energy coupling from the source to the device is selected. The device is continuously irradiated with radiation of this frequency.

8 Claims, 1 Drawing Sheet

ELIMINATION OF STICKING OF MICRO-MECHANICAL DEVICES

TECHNICAL FIELD OF THE INVENTION

This invention relates to micro-mechanical devices, and more particularly, to micro-mechanical devices having moving elements that tend to stick and the avoidance of such sticking.

BACKGROUND OF THE INVENTION

A recent development in the field of electro-mechanics has been the miniaturization of various mechanical devices. These "micro-mechanical" devices are manufactured using integrated circuit techniques. Typical of such devices are tiny motors, used in applications such as medicine.

Reliability has been difficult to achieve with micro-mechanical devices. A common reliability problem is sticking, which occurs when the device has a moving part that contacts another surface of the device. The moving element may become stuck against that surface and the device ceases to operate properly.

SUMMARY OF THE INVENTION

One aspect of the invention is a method of preventing sticking of contacting elements of a micro-mechanical device, such as a digital micro-mirror device (DMD). A set of electromagnetic microwave frequencies is determined, which when applied to the contacting elements, will cause the radiation to become absorbed by water molecules on their surface. From this set of electromagnetic microwave frequencies, an applied frequency that provides a desired energy coupling to said contacting elements is selected. The contacting elements are irradiated with radiation at this applied frequency, using a microwave source. The radiation may be directed to the device via a waveguide, or the device may be placed in a resonant cavity. Also, the irradiation may occur while the device is in operation, or while the device is detached.

A technical advantage of the invention is that it prevents sticking during operation of micro-mechanical devices. It is an alternative to other approaches to the problem, which require additional steps or materials during the manufacturing process. The power levels may be very low, resulting in a solution that is inexpensive and safe.

DETAILED DESCRIPTION OF THE INVENTION

For purposes of example, the following description is in terms of a particular type of micro-mechanical device, a digital micro-mirror device (DMD). In this type of device, tiny mirrors tilt to reflect light to an image plane. An array of these mirrors is used to form an image. In the case of a DMD, the method of the invention prevents sticking of the mirrors to a "landing pad" which they touch when tilted. However, the invention could be used with any type of micro-mechanical device having some component that moves against another surface to which it might become stuck.

Figure 1:
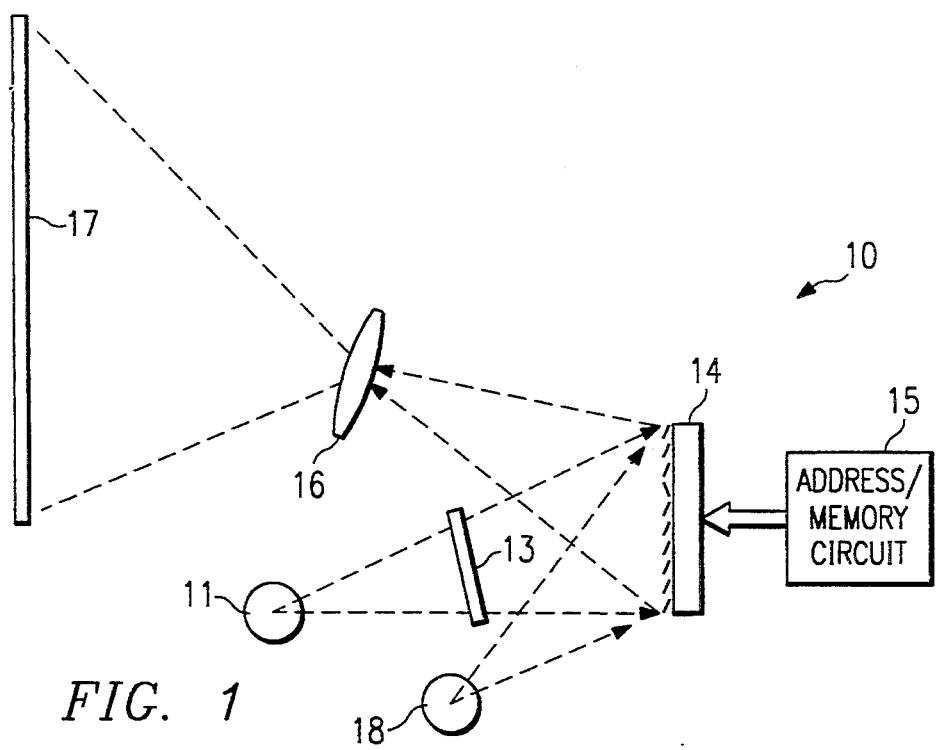
FIG. 1 illustrates one type of micro-mechanical device, a digital micro-mirror device (DMD), having an irradiator in accordance with the invention.

FIG. 1 illustrates a projection display system 10, which uses a digital micro-mirror device (DMD) 14 and has a microwave irradiator 18 in accordance with the invention. The system is comprised of a light source 11, a color wheel filter 13, a DMD 14, an address/memory circuit 15, a projector lens 16, and a screen 17. Irradiator 18 provides a continuous beam of microwaves to the surface of DMD 14.

Figure 2:
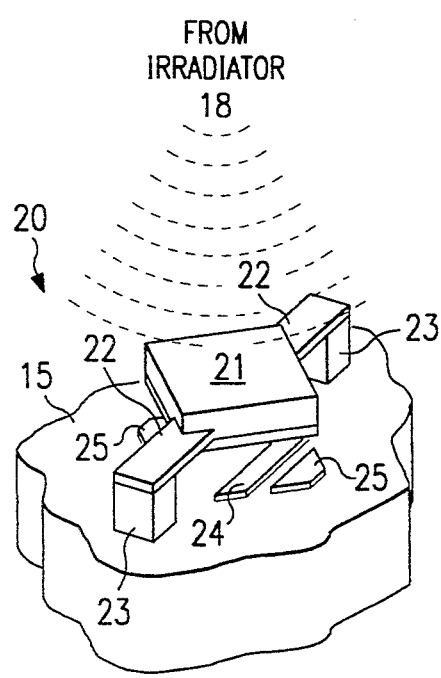
FIG. 2 illustrates a single mirror element of the DMD of FIG. 1 being irradiated in accordance with the invention.

FIG. 2 illustrates a single mirror element 20 of DMD 11. A typical DMD 14 has an array of hundreds of such mirror elements 20. Light from source 11 is incident on the surface of the mirror elements 20. Each mirror element 20 reflects light for one pixel of an image frame.

Referring to both FIGS. 1 and 2, a light source 11 illuminates the surface of DMD 14 with visible white light. Light source 11 may include a condenser lens (not shown) to direct a beam to DMD 14. Each mirror element 20 has a tilting mirror 21 supported by torsion hinges 22 attached to support posts 23. The mirrors 21 are positioned over an address/memory circuit 15, which is fabricated on a silicon substrate. Electrostatic forces based on the data in the memory cells of address-/memory circuit 15 tilt each mirror 21 either +10 degrees (on) or −10 degrees (off), thereby modulating the light incident on the surface of the DMD 11. Light reflected from the on mirrors 21 passes through a projection lens 16 and creates images on the screen 17. Light from the off mirrors is reflected away from the projection lens 16. The proportion of time during each image frame that a mirror 21 remains in the on position determines shades of grey. Color can be added by means of a color wheel filter 13, or by a three-DMD setup (not shown).

Referring now especially to FIG. 2, directly over each memory cell 15, are two address electrodes 24 and two landing pads 25. The mirror 21 has three states. It operates in a bistable mode, tilting 10 degrees about the hinges 22 in one or the other direction. The third state is a flat position to which the mirrors 21 return when the display is not in operation.

In effect, the mirror 21 and the address electrodes 24 form capacitors. When +5 volts (digital 1) is applied to one address electrode 24, 0 volts (digital 0) is applied to the other address electrode 24, and a negative bias to the mirror 21, the electrostatic charge thus created causes mirror 21 to tilt toward the +5 volt electrode 24. The voltage on the address electrode 24 starts the mirror 21 tilting, whereupon it continues under its own momentum until it hits the landing pad 25.

Once a mirror 21 tilts in either direction, it remains electromechanically latched in that state. Merely changing the states of the address electrodes 24 will not cause the mirror to move; it is removal of the bias on each mirror 21 that causes it to return to its untilted position. As explained below, irradiator 18 prevents the edge of mirror 21 from sticking to landing pad 25. When the bias is reapplied, the mirrors 21 tilt in accordance with their new address states.

The mirror element 20 of FIG. 2 has a "torsion beam" design. However, the invention is useful with other DMD designs. For example, in a cantilever design, a mirror is supported at one end by a hinge and its free end tilts down toward its address electrodes. A contacting free end might also experience a sticking problem. Furthermore, as stated above, the invention is useful with any micro-mechanical device having a moving part that contacts another surface.

As stated above, irradiator 18 provides microwave radiation incident on the surface of DMD 14 to prevent mirrors 21 from sticking to landing pads 25 when the bias is removed. The operation of irradiator 18 is based on the assumption that sticking of micro-mechanical elements, such as the mirrors 21 of a DMD 14, is caused by a Van der Waal's interaction. This interaction is mediated by water vapor absorbed on surfaces of the tips of mirrors 21 and on surfaces of the landing pads 25. To counteract the absorption of water vapor, irradiator 18 irradiates DMD 14 with microwaves at a frequency that resonates with water molecules.

Figure 3:
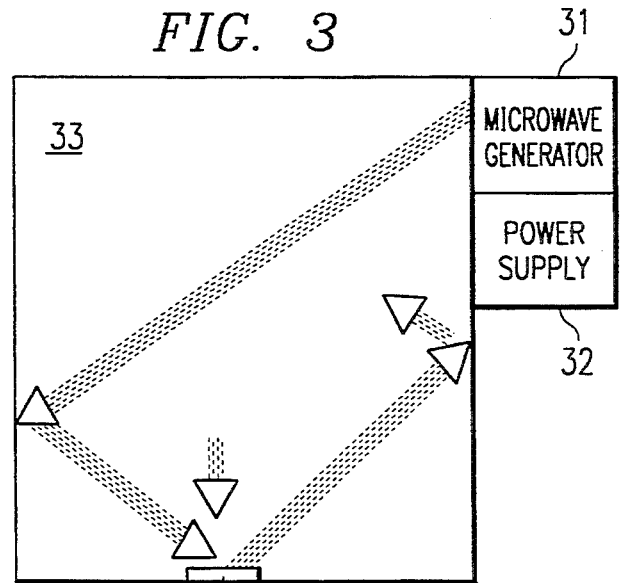
FIGS. 3 and 4 illustrate implementations of the irradiator of FIG. 1.
Figure 4:
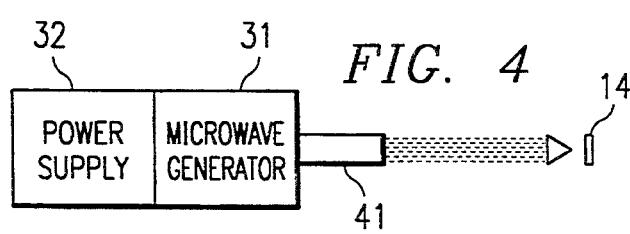

FIGS. 3 and 4 are block diagrams of two embodiments of irradiator 18. Either embodiment may be integrated with a system that uses a DMD, such as the display system of FIG. 1 or such as a DMD printer, where the DMD is irradiated during its operation. Or, the irradiators of FIGS. 3 and 4 could be used to dry a detached DMD, as part of a maintenance procedure.

Both embodiments of irradiator 18 have a microwave generator 31, which converts electric power from power supply 32 to microwave power. In the embodiment of FIG. 3, the device being irradiated, here DMD 14, is enclosed entirely or in part, by a resonance housing 33. In the embodiment of FIG. 4, the beam from irradiator 31 is directed to DMD 14 via a waveguide 41.

Microwave generator 31 may be of various types, such as klystron, magnetron, or traveling wave tube. Depending on characteristics of the device being irradiated, generator 31 may provide a continuous or pulsed radiation. For preventing sticking of DMDs, the radiation is preferably continuous. The desired output of generator 31 is selected in terms of various factors, such as frequency, energy coupling to the device being irradiated, and power.

One characteristic of a suitable frequency is that it result in a resonance state of water molecules. At various optimum frequencies, irradiation from microwave generator 31 is strongly absorbed by water molecules on the surface of the device being irradiated. This absorption causes the water molecules to become excited, resulting in heat. The heat results in a departure of the water molecules from the surface as water vapor, and thus the device becomes dry. At these various frequencies, the absorption by, and excitation of, water molecules is maximized. In general, these frequencies occur at the frequencies of vibrational or rotational excitation modes of water.

The determination of these optimum frequencies can be made by various techniques used in other applications of microwaves. For example, in the field of microwave communications, it is known that certain wavelengths, such as 3–5 microns and 8–12 microns, are good for transmission because they do not result in a high degree of absorption by water molecules. The techniques used for finding good radar transmission frequencies can be used to determine poor frequencies for purposes of the invention. As another example, in the field of microwave cooking, it is known that a frequency of 2450 megahertz, having a wavelength of approximately 12.245 centimeters, provides good heating for foods.

With these considerations, the frequency of the microwaves generated by generator 31 may be anywhere within what is considered to be the microwave range of frequencies, i.e., 500 megahertz to 500 gigahertz. As explained below, the optimum frequency might also include far infrared frequencies.

Another consideration in selecting the wavelength of the output of irradiator 18 is the amount of diffraction of the incident beam by the DMD structure. This results in poor energy coupling of the output of irradiator 18 to the appropriate locations on the DMD 14. In general, the larger the dimensions of the pixel structure on the DMD relative to the wavelength, the lesser the effect of diffraction. For example, a typical DMD 14 has pixels with spacing of 17 micrometers. Wavelengths toward the shorter range of microwave wavelengths, for example in the order of 1 centimeter, or even in the far infrared range, would be more suited for use with a DMD with pixels of this size. Likewise, for other micromechanical devices, as the feature spacing being irradiated decreases, the wavelength would also decrease.

With respect to the power required for microwave generator 31, because the sticking force of typical micro-mechanical devices is not large, the radiation power output of irradiator 18 need not be great. Thus, irradiator 18 may be a low power device. Linear beam tubes, such as the klystron and traveling wave tube, may be used instead of crossed-field tubes, such as the magnetron.

In FIG. 3, the device being irradiated is placed in a housing 33, which is a resonant cavity. The energy that does not strike the device directly is repeatedly reflected by the inner walls of housing 33. The dimensions of chamber 33 are selected so that the microwave intensity is concentrated at the center, where the device is placed. The housing 33 also provides a shield to prevent microwave exposure in the surrounding environment.

In FIG. 4, waveguide 41 provides a directed microwave beam. The diameter of this beam is sufficiently large so as the cover the surface likely to become stuck. In the case of a DMD 14, the entire array of mirrors 21 would receive incident radiation. The dimensions of waveguide 41 are related to the efficacy of transmission of the selected frequency. An advantage of using shorter wavelengths is that waveguide 41 can be shorter in length and smaller in cross-section. A shorter wavelength will permit a tighter beam of irradiation, and a more efficient energy coupling.

One aspect of the invention is a method of determining the optimum frequency and power for irradiating a particular micro-mechanical device. Different devices, being made from different materials with different water bonding characteristics, will have different optimum values. A given device can be operated until it becomes stuck, and then irradiated with a known frequency until it becomes unstuck. This test can be repeated for a number of frequencies, at a constant power, until a frequency providing the best results can be selected. Preferably, microwave generator 31 is tunable for this purposes. Likewise, the power delivered by microwave generator 31 can varied at a constant frequency until an optimum power is determined. Microwave power can be measured by sensors that convert rf power to measurable dc or low frequency electrical signals. Examples of such sensors are thermistors, thermocouplers, and diode sensors.

An irradiator 18 having an output frequency of 2.45 gigahertz (2450 megahertz), which is that of commercial microwave equipment such as ovens, has been experimentally tested. The wavelength of this frequency is approximately 12.25 centimeters, and when irradiated at this frequency, water molecules will resonate. An advantage of this frequency is that it is within a frequency band already allocated for fixed services.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of preventing sticking of contacting elements of a micro-mechanical device, comprising the steps of:

determining a set of electromagnetic microwave frequencies that when applied to said contacting elements, will cause said radiation to become absorbed by water molecules on the surface of said contacting elements;

selecting from said set of electromagnetic microwave frequencies, an applied frequency that provides a desired energy coupling to said contacting elements; and irradiating said contacting elements with radiation having said applied frequency, using a microwave source.

2. The method of claim 1, wherein said irradiating step is performed while said device is in operation.

3. The method of claim 1, wherein said irradiating step is performed while said device is not in operation.

4. The method of claim 1, wherein said applied frequency is 2.45 gigahertz.

5. The method of claim 1, wherein said irradiating step is performed with a waveguide that provide a directed beam of said radiation.

6. The method of claim 1, further comprising the step of placing said device into a resonant cavity prior to said irradiating step.

7. The method of claim 1, wherein said determining step is accomplished by analyzing the water bonding properties of said contacting elements.

8. The method of claim 1, wherein said microwave source is a magnetron.

* * * * *